US011950359B2

(12) United States Patent
Uchiyama et al.

(10) Patent No.: US 11,950,359 B2
(45) Date of Patent: Apr. 2, 2024

(54) CARD READER

(71) Applicant: NIDEC SANKYO CORPORATION, Nagano (JP)

(72) Inventors: Ryo Uchiyama, Nagano (JP); Masaya Fujimoto, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 17/841,853

(22) Filed: Jun. 16, 2022

(65) Prior Publication Data

US 2022/0408551 A1 Dec. 22, 2022

(30) Foreign Application Priority Data

Jun. 16, 2021 (JP) ................................. 2021-100490

(51) Int. Cl.
*G06K 7/08* (2006.01)
*H05K 1/02* (2006.01)
(52) U.S. Cl.
CPC ........... *H05K 1/0268* (2013.01); *G06K 7/082* (2013.01); *H05K 1/028* (2013.01); *H05K 2201/08* (2013.01)
(58) Field of Classification Search
CPC .. H05K 1/0268; H05K 1/028; H05K 2201/08; H05K 1/118; H05K 1/0275; G06K 7/082
See application file for complete search history.

(56) References Cited

U.S. PATENT DOCUMENTS

2018/0285604 A1* 10/2018 Miyazawa ........... H05K 1/0275
2018/0288871 A1* 10/2018 Fujimoto ............... H05K 1/028
2019/0095659 A1* 3/2019 Takeuchi ............. G06K 7/0021

FOREIGN PATENT DOCUMENTS

| CN | 202795562 U | * | 3/2013 |
| JP | 2018169833 A | | 11/2018 |
| JP | 2018170422 A | | 11/2018 |

OTHER PUBLICATIONS

CN202795562U, An anti-vandalism card reader card slot, English machine translation, 5 pages (Year: 2023).*

* cited by examiner

*Primary Examiner* — Tuyen K Vo
(74) *Attorney, Agent, or Firm* — CANTOR COLBURN LLP

(57) ABSTRACT

A card reader for use with a card may include a card insertion part provided with an insertion port into which the card is inserted, a protruded part which is provided on a front face of the card insertion part and is protruded to a front side with respect to the card insertion part, a breakage detection wiring which is provided in an inside of the protruded part, and a detection part which detects at least one of disconnection and a short circuit of the breakage detection wiring.

9 Claims, 6 Drawing Sheets

CARD READER

CROSS REFERENCE TO RELATED APPLICATION

The present invention claims priority under 35 U.S.C. § 119 to Japanese Application No. 2021-100490 filed Jun. 16, 2021, the entire content of which is incorporated herein by reference.

TECHNICAL FIELD

At least an embodiment of the present invention may relate to a card reader.

BACKGROUND

Conventionally, a card reader has been known which is provided in a transaction terminal apparatus such as an ATM (Automated Teller Machine) and performs reading and the like of magnetic data stored in a magnetic stripe of a magnetic card. In Japanese Patent Laid-Open No. 2018-170422 (Patent Literature 1) and Japanese Patent Laid-Open No. 2018-169833 (Patent Literature 2), a card reader is described which is capable of preventing illegal acquisition of data from a data signal circuit in a card reader, which is provided with a flexible printed circuit board in which the data signal circuit is formed for transmitting a signal of data read from a card and a signal of data to be recorded to the card.

In an existing card reader into which a magnetic card is capable of being inserted, there is a card reader in which a front face (face on a user side) of its card insertion port is formed in a flat shape and a magnetic data swindle member (overlay skimmer) is easily attached. In such a card reader, a crime is conceivable that a magnetic data swindle member is attached to a front face of a card insertion port and a third person swindles magnetic data of a magnetic card which is inserted into the card reader.

SUMMARY

In view of the problem described above, at least an embodiment of the present invention may advantageously provide a card reader which is capable of suppressing a swindle of magnetic data due to attachment of a magnetic data swindle member.

According to at least an embodiment of the present invention, there may be provided a card reader including a card insertion part having an insertion port into which a card is inserted, a protruded part which is provided on a front face of the card insertion part and is protruded to a front side from the card insertion part, a breakage detection wiring which is provided in an inside of the protruded part, and a detection part which detects at least one of disconnection and a short circuit of the breakage detection wiring.

Effects of the Invention

According to the present invention, a swindle of magnetic data due to attachment of a magnetic data swindle member can be suppressed.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and in which like elements are numbered alike in several Figures. In the drawings.

DETAILED DESCRIPTION

At least an embodiment of the present invention will be described below with reference to the accompanying drawings.

(Entire Structure of Card Reader)

Figure 1:
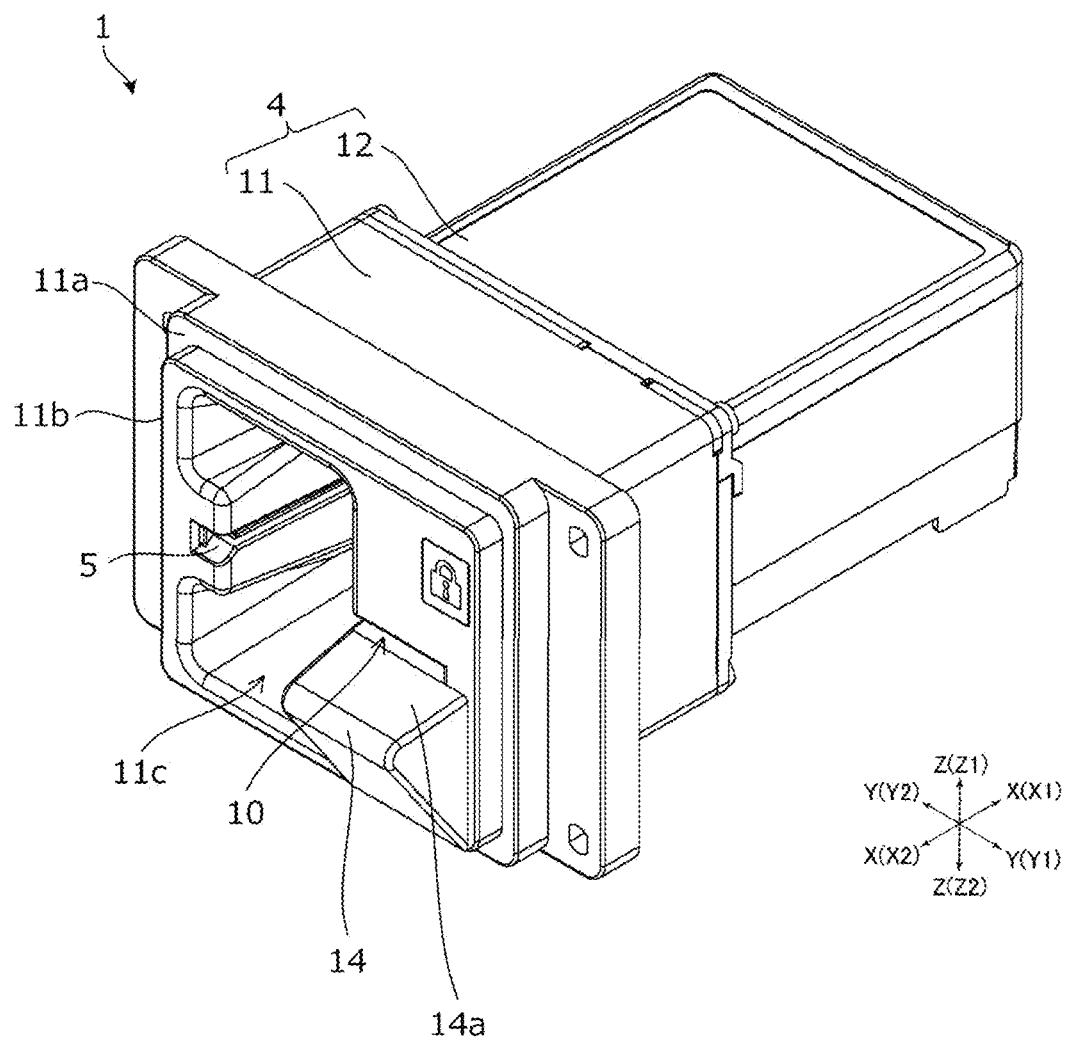
FIG. 1 is a perspective view showing a card reader 1 in accordance with an embodiment of the present invention.
Figure 2:
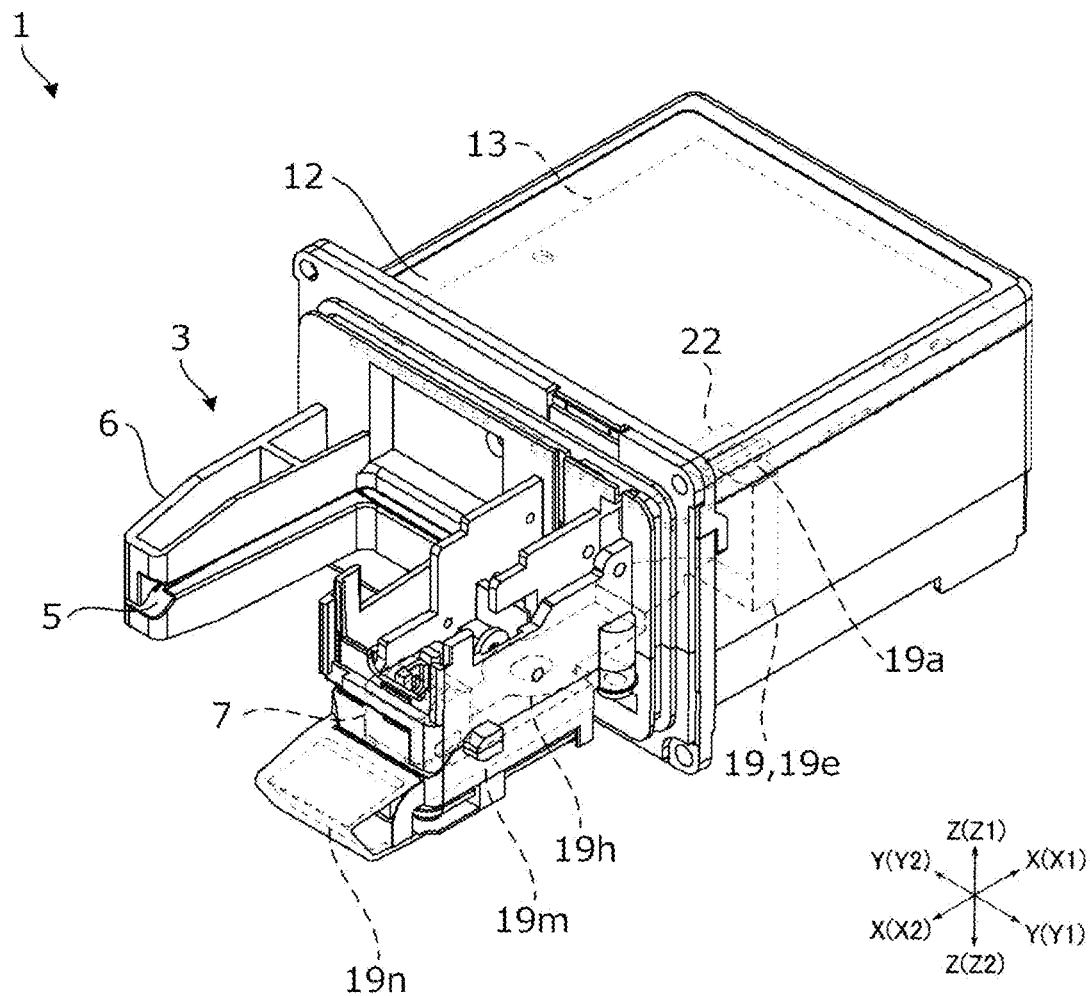
FIG. 2 is an exploded perspective view showing the card reader 1 in FIG. 1 from which a front face cover 11 is detached.
Figure 3:
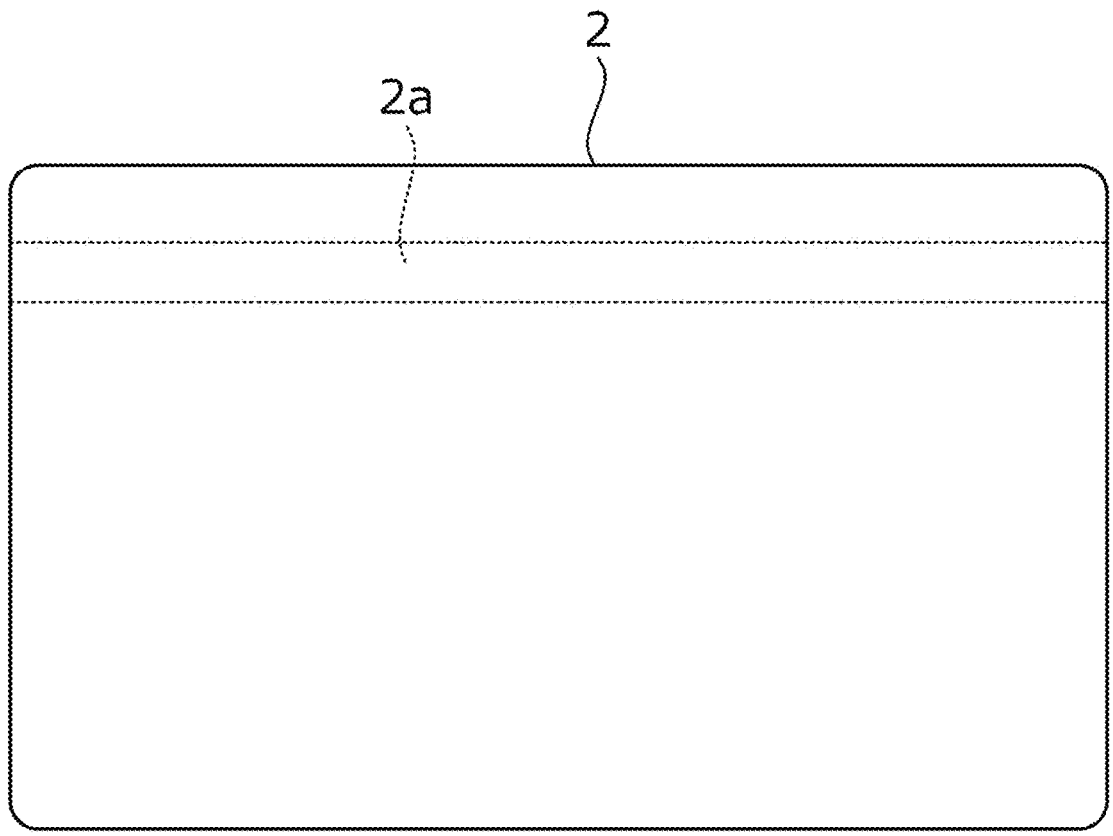
FIG. 3 is a view showing a card 2 which is one example of a reading object by the card reader 1.

FIG. 1 is a perspective view showing a card reader 1 in accordance with an embodiment of the present invention. FIG. 2 is an exploded perspective view showing the card reader 1 in FIG. 1 from which a front face cover 11 is detached. FIG. 3 is a view showing a card 2 which is one example of a reading object by the card reader 1.

A card reader 1 in this embodiment is a device which performs reading of data recorded in a card 2 and recording of data to the card 2. Specifically, the card reader 1 is a so-called dip type card reader in which insertion of a card 2 to the card reader 1 and pulling-out of the card 2 from the card reader 1 are manually performed to perform reading and recording of data. The card reader 1 is, for example, mounted and used in an oil supply device of an unmanned or a self-service type gas station or in a host apparatus such as an ATM.

A card 2 is, for example, a card made of vinyl chloride in a rectangular shape whose thickness is about 0.7-0.8 mm. One face of the card 2 is formed with a magnetic stripe 2a in which magnetic data are recorded. Further, it may be structured that an IC (integrated circuit) chip is incorporated in the card 2 and the other face of the card 2 is formed with an external connection terminal (not shown) of the IC chip. In accordance with an embodiment of the present invention, a card 2 may be a PET (polyethylene terephthalate) card whose thickness is about 0.18-0.36 mm or a paper card having a predetermined thickness.

The card reader 1 includes a card reader main body 3 and a case body 4 which covers the card reader main body 3. The card reader main body 3 includes a main body frame 6 in which a card moving path 5 where a card 2 is moved is formed, a magnetic head 7 which performs at least one of reading of magnetic data recorded in a card 2 and recording of magnetic data to the card 2, and an IC contact block (not shown) having a plurality of IC contact springs for communicating data with an IC chip incorporated in the card 2.

The case body 4 is structured of a front face cover 11 in which an insertion port 10 for a card 2 is formed and a case main body 12. Further, the card reader 1 includes, as shown in FIG. 2, a control circuit board 13 which is a printed circuit board for control. The control circuit board 13 is an example of a detection part which detects at least one of disconnection and a short circuit of a breakage detection wiring 33d described below.

In this embodiment, a card 2 which is manually operated is moved in the "X" direction shown in FIG. 1 and the like. In other words, the "X" direction is a moving direction of a card 2 which is moved along the card moving path 5. Further, the card 2 is inserted to the "X1" direction side and pulled out to the "X2" direction side. Further, the "Z" direction in FIG. 1 and the like which is perpendicular to the "X" direction is a thickness direction of a card 2 which is moved along the card moving path 5, and the "Y" direction in FIG. 1 and the like which is perpendicular to the "X" direction and the "Z" direction is a width direction (short width direction) of the card 2 which is moved along the card moving path 5.

In the following descriptions, the "X" direction is referred to as a front and rear direction, the "Y" direction is referred to as a right and left direction, and the "Z" direction is referred to as an upper and lower direction. Further, the "X1" direction side which is an inserting direction side of a card 2 to the card reader 1 is referred to as a "rear" side, and the "X2" direction side which is a pulling-out direction side of the card 2 from the card reader 1 is referred to as a "front" side. Further, the "Y1" direction side which is one side in the right and left direction is defined as a "right" side, the "Y2" direction side which is the other side in the right and left direction is defined as a "left" side, the "Z1" direction side which is one side in the upper and lower direction is referred to as an "upper" side, and the "Z2" direction side which is the other side in the upper and lower direction is referred to as a "lower" side. Further, faces on the "X2" direction side of respective parts of the card reader 1 are referred to as a front face. Further, sides on respective parts in the "Y" direction of the card reader 1 are referred to as a side.

A front face cover 11 is disposed on a front face side of the main body frame 6 and covers a front face side portion of the main body frame 6. Further, the front face cover 11 structures a front face of the card reader 1. A front face side of the front face cover 11 is formed with an attaching face 11a of the card reader 1 to a host apparatus. The attaching face 11a is formed to be a flat face perpendicular to the front and rear direction. Further, the front face side of the front face cover 11 is formed with an exposed part 11b which is disposed in an opening formed in a front face panel of the host apparatus. The exposed part 11b is formed so as to protrude from the attaching face 11a to the front side and, when the card reader 1 is attached to the host apparatus, the exposed part 11b structures a part of the front face panel of the host apparatus. The exposed part 11b is an example of a card insertion part having an insertion port 10 into which a card 2 is inserted.

Further, the front face cover 11 is formed with a finger insertion part 11c which is recessed toward the rear side from the front face of the exposed part 11b. The finger insertion part 11c is formed to be a size into which fingers of a user are capable of being inserted and, when a user inserts a card 2 into the card reader 1 and, when a user pulls out the card 2 from the card reader 1, fingers of the user are inserted into the finger insertion part 11c. The insertion port 10 is formed in the front face of the exposed part 11b, and both right and left side faces and a rear face of the finger insertion part 11c.

A portion of the front face of the exposed part 11b adjacent to the insertion port 10 is provided with a protruded part 14. As a result, in the front face of the exposed part 11b, only a part of a portion surrounding the insertion port 10 is formed in a protruded shape by the protruded part 14 and thus, a magnetic data swindle member is difficult to be attached at a periphery of the insertion port 10 in the front face of the exposed part 11b. Especially, it is difficult that a plate-shaped magnetic data swindle member having an opening part communicating with the insertion port 10 is attached to the front face of the exposed part 11b. As a result, a swindle of magnetic data by attaching a magnetic data swindle member can be suppressed.

Further, the protruded part 14 is provided at a position adjacent to a portion of the insertion port 10 in the card reader 1 where a magnetic stripe 2a inserted into the insertion port 10 is passed, in other words, the protruded part 14 is provided in front of the magnetic head 7. As a result, attachment of a magnetic data swindle member is further difficult which is required to dispose a magnetic head or the like at a periphery of a portion where a magnetic stripe 2a is passed for swindling magnetic data of the card 2.

The protruded part 14 is formed in a substantially triangular shape which has a bottom side parallel to another portion of the front face of the exposed part 11b when viewed in the "Y" direction. Further, an upper face 14a of the protruded part 14 is smoothly connected with a bottom face of the insertion port 10 (card moving path 5) and, when a card 2 is inserted to the "X1" direction side so as to slide on the upper face 14a, the card 2 is easily inserted into the insertion port 10.

Further, a rectangular part 19n of a flexible printed circuit board 19 is provided in an inside of the protruded part 14, and a breakage detection wiring 33d is formed in the rectangular part 19n. The rectangular part 19n and the breakage detection wiring 33d will be described below with reference to FIG. 5. When the protruded part 14 is damaged, the breakage detection wiring 33d in an inside of the protruded part 14 is disconnected or short-circuited and thus, breakage of the protruded part 14 is detected. As a result, even when the protruded part 14 is damaged and a magnetic data swindle member is attached, a swindle of magnetic data can be suppressed by performing processing such as a function stop.

The case main body 12 is formed in a substantially rectangular parallelepiped box shape whose front end is opened. The front face cover 11 and the case main body 12 are fixed to each other in a state that a rear end of the front face cover 11 and a front end of the case main body 12 are abutted with each other. The case body 4 covers the card reader main body 3 on both faces in the upper and lower direction, both side faces in the right and left direction and both faces in the front and rear direction.

The control circuit board 13 is a rigid circuit board which is formed in a substantially rectangular flat plate shape. The control circuit board 13 is fixed to an upper face of a card accommodation part in the main body frame 6 where a rear end side portion of an inserted card 2 is accommodated. The magnetic head 7 is electrically connected with the control circuit board 13 through the flexible printed circuit board 19. As shown in FIG. 2, the control circuit board 13 is mounted with a connector 22 which is connected with the flexible printed circuit board 19.

The control circuit board 13 is provided with a data signal circuit layer in which a data signal circuit is formed for transmitting a signal of magnetic data (data signal) read from a magnetic stripe of a card 2 by the magnetic head 7 and a data signal to be recorded in the magnetic stripe of the card 2 by the magnetic head 7.

In this embodiment, in a case that some fraudulent act is performed for illegally acquiring data by a criminal, when disconnection or a short circuit of breakage detection wirings 33a and 33b described below which are formed in the flexible printed circuit board 19 are detected or, when disconnection or a short circuit of a breakage detection wiring 33d in an inside of the protruded part 14 is detected, processing for preventing a swindle of magnetic data is performed. The processing is predetermined processing which includes, for example, erasure of data stored in the control circuit board 13, setting a state that the control circuit board 13 is unable to use (function stop state), or notifying abnormality to the host apparatus.

(Structure of Flexible Printed Circuit Board)

Figure 4:
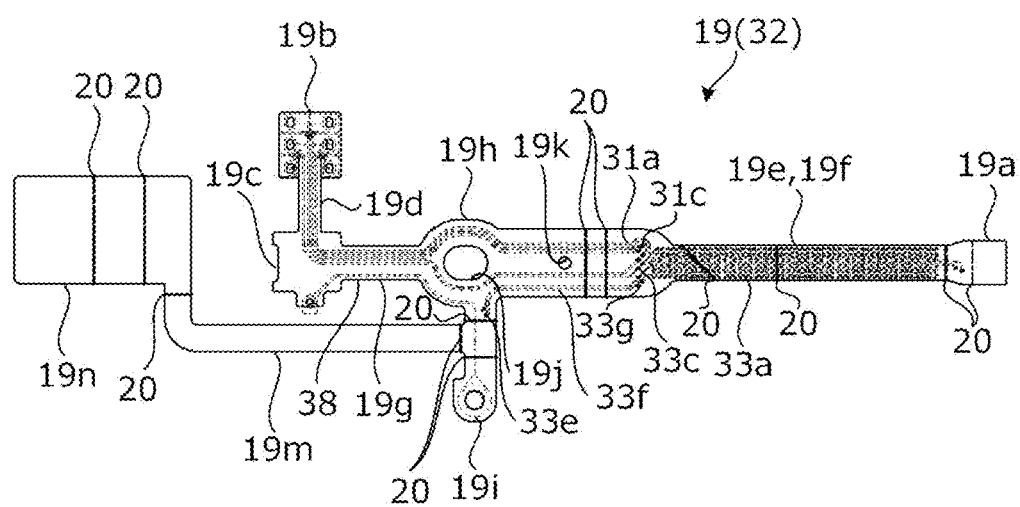
FIG. 4 is a developed view showing a first circuit layer 32 of a flexible printed circuit board 19.
Figure 5:
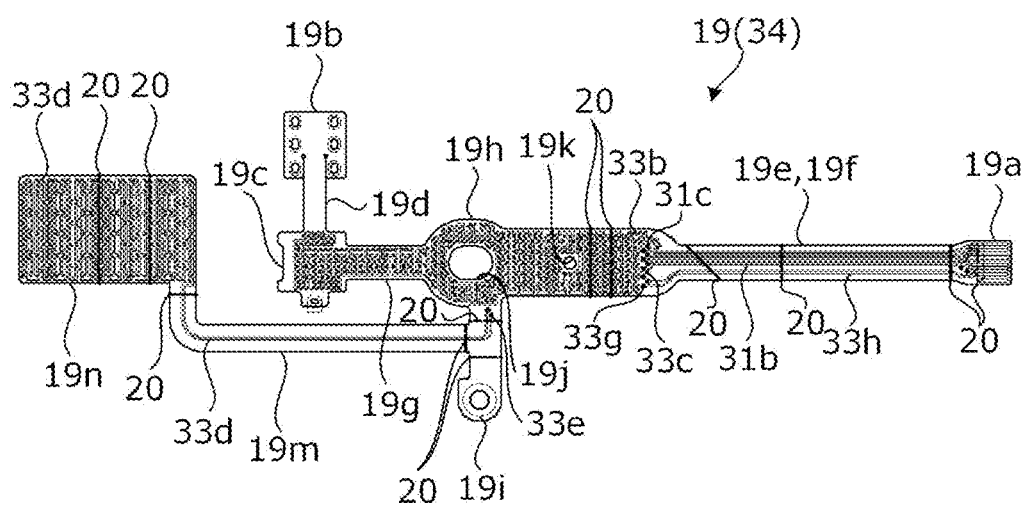
FIG. 5 is a developed view showing a second circuit layer 34 of the flexible printed circuit board 19.
Figure 6:
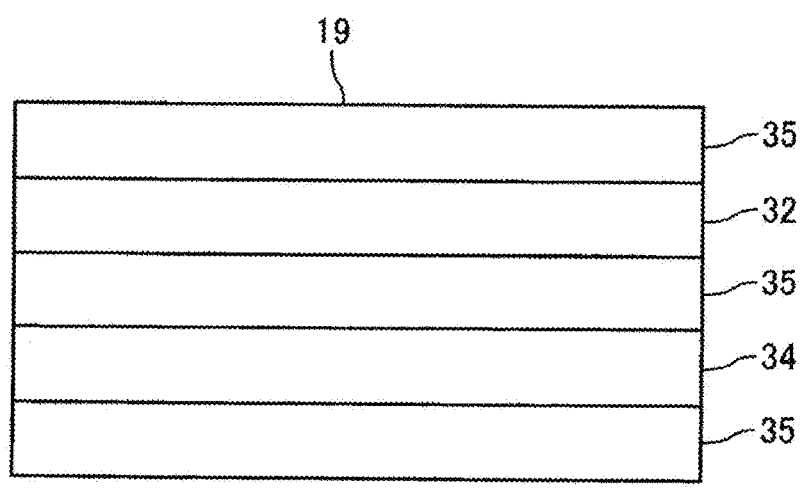
FIG. 6 is an explanatory cross-sectional view showing a multilayer configuration of the flexible printed circuit board 19.

FIG. 4 is a developed view showing a first circuit layer 32 of the flexible printed circuit board 19. FIG. 5 is a developed view showing a second circuit layer 34 of the flexible printed circuit board 19. FIG. 6 is an explanatory cross-sectional view showing a multilayer configuration of the flexible printed circuit board 19.

As shown in FIG. 6, the flexible printed circuit board 19 is provided with a first circuit layer 32 (see FIG. 4), a second circuit layer 34 (see FIG. 5) and insulating layers 35 which protect the first circuit layer 32 and the second circuit layer 34. Further, as shown in FIG. 6, the insulating layer 35, the first circuit layer 32, the insulating layer 35, the second circuit layer 34 and the insulating layer 35 are laminated in this order from one side face toward the other side face of the flexible printed circuit board 19. In other words, the second circuit layer 34 is overlapped with the first circuit layer 32 through the insulating layer 35.

A plurality of bent parts 20 formed in the flexible printed circuit board 19 is portions which are capable of bending. The flexible printed circuit board 19 is accommodated in the card reader 1 shown in FIG. 1 and FIG. 2 in a bent state at the bent parts 20 (see FIG. 2).

The flexible printed circuit board 19 is formed in a "Y" shape having three end parts. A first end part of the flexible printed circuit board 19 is connected with the connector 22 of the control circuit board 13. A second end part of the flexible printed circuit board 19 is connected with the magnetic head 7. A third end part of the flexible printed circuit board 19 is extended to an inside of the protruded part 14. The flexible printed circuit board 19 is routed along the main body frame 6 in a state that the respective bent parts 20 are bent in a predetermined shape.

The flexible printed circuit board 19 is structured of a connected part 19a which is connected with the connector 22, a connected part 19b which is connected with the magnetic head 7, a cover part 19c which covers the connected part 19b, a connection part 19d which connects the connected part 19b with the cover part 19c, a connection part 19e which connects the connected part 19a with the cover part 19c, a connection part 19m which connects a rectangular part 19n provided in the inside of the protruded part 14 with the connection part 19e, and a ground part 19i which is connected with the connection part 19m.

The connected part 19a is formed in a substantially rectangular shape. Each of the connected part 19b and the cover part 19c is formed in a substantially square shape. The connection part 19d is formed in a straight line shape. The connection part 19e is structured of a first straight line connection part 19f and a second straight line connection part 19g which are formed in a straight line shape, and an elliptical connection part 19h in a substantially elliptical shape which is disposed between the first straight line connection part 19f and the second straight line connection part 19g. One end of the first straight line connection part 19f is connected with the connected part 19a, and the other end of the first straight line connection part 19f is connected with the elliptical connection part 19h. One end of the second straight line connection part 19g is connected with the cover part 19c, and the other end of the second straight line connection part 19g is connected with the elliptical connection part 19h.

The first straight line connection part 19f and the second straight line connection part 19g are formed so that the first straight line connection part 19f and the second straight line connection part 19g are disposed on the same straight line in a state that the flexible printed circuit board 19 is developed. The connection part 19d is formed so that the second straight line connection part 19g and the connection part 19d are perpendicular to each other in a state that the flexible printed circuit board 19 is developed. The elliptical connection part 19h is formed with two through holes 19j and 19k.

The connected part 19b is soldered and connected with a lower end part of the magnetic head 7. The cover part 19c covers the connected part 19b from a lower side. The connection part 19d is folded back so that the connected part 19b is covered by the cover part 19c. In this embodiment, the connected part 19b, the connection part 19d and the cover part 19c are covered by a sealing member (not shown) made of resin. The connection part 19e is routed toward a rear side from the magnetic head 7.

The first circuit layer 32 (see FIG. 4) is formed with a data signal circuit 31a for transmitting a data signal (specifically, for transmitting at least one of a data signal read from a card 2 and a data signal to be recorded to the card 2), and a breakage detection wiring 33a for detecting its own disconnection and a short circuit. The second circuit layer 34 (see FIG. 5) is formed with a data signal circuit 31b for transmitting the data signal and a breakage detection wiring 33b for detecting its own disconnection and a short circuit.

The data signal circuit 31a of the first circuit layer 32 is connected with the data signal circuit 31b of the second circuit layer 34 through the connection part 31c which conducts from the first circuit layer 32 to the second circuit layer 34. The breakage detection wiring 33a of the first circuit layer 32 is connected with the breakage detection wiring 33b of the second circuit layer 34 through the connection part 33c which conducts from the first circuit layer 32 to the second circuit layer 34.

Further, the first circuit layer 32 is formed with a breakage detection wiring 33f for detecting its own disconnection and a short circuit. The second circuit layer 34 is formed with breakage detection wirings 33d and 33h for detecting its own disconnection and a short circuit. One end of the breakage detection wiring 33f of the first circuit layer 32 is connected with the breakage detection wiring 33d of the second circuit layer 34 through the connection part 33e which conducts to the second circuit layer 34 from the first circuit layer 32. The other end of the breakage detection wiring 33f of the first circuit layer 32 is connected with the breakage detection wiring 33h of the second circuit layer 34 through the connection part 33g which conducts to the second circuit layer 34 from the first circuit layer 32. Further, the first circuit layer 32 is formed with a ground circuit 38 which is connected with the ground part 19i.

As shown in FIG. 4 and FIG. 5, an outer shape of the first circuit layer 32 and an outer shape of the second circuit layer 34 are substantially the same as an outer shape of the flexible printed circuit board 19. Further, an outer shape of the insulating layer 35 is substantially the same as the outer shape of the flexible printed circuit board 19.

The data signal circuits 31a and 31b transmit magnetic data signals. The data signal circuits 31a and 31b are structured of a plurality of pattern wiring lines. In this embodiment, the magnetic head 7 is a three channel-type magnetic head, and the data signal circuits 31a and 31b are structured of six pattern wiring lines. One end (end part on a side of the data signal circuit 31a) of the data signal circuits 31a and 31b is connected with the magnetic head 7, and the other end (end part on a side of the data signal circuit 31b) of the data signal circuits 31a and 31b is connected with the control circuit board 13.

A breakage detection signal which is a digital signal in a rectangular wave shape is supplied to the breakage detection wirings 33a and 33b. The breakage detection wirings 33a and 33b are structured of one wiring line which is formed in the flexible printed circuit board 19. In the embodiment shown in FIG. 4 and FIG. 5, the breakage detection wiring 33a of the first circuit layer 32 is closely and densely extended and provided in the first straight line connection part 19f. The breakage detection wiring 33b of the second circuit layer 34 is closely and densely extended and provided in the cover part 19c, the second straight line connection part 19g and the elliptical connection part 19h.

One end of the wiring line which forms the breakage detection wirings 33a and 33b is connected with a breakage detection circuit formed in the control circuit board 13, and the other end of the wiring line forming the breakage detection wirings 33a and 33b is grounded. Further, the one end of the wiring line forming the breakage detection wirings 33a and 33b is connected with a battery which is mounted on the control circuit board 13 through the breakage detection circuit of the control circuit board 13. The breakage detection wirings 33a and 33b are extended from the connected part 19a and routed through the first straight line connection part 19f, the elliptical connection part 19h, the second straight line connection part 19g and the cover part 19c in this order, and then, turned around in the cover part 19c and routed to the connected part 19a.

When the breakage detection circuit which is formed in the control circuit board 13 detects at least one of disconnection and a short circuit of the breakage detection wirings 33a and 33b based on a potential variation of the breakage detection wirings 33a and 33b, the above-mentioned processing for suppressing a swindle of magnetic data is performed. As a result, in a case that some act is performed in the connection part 19e or the like of the flexible printed circuit board 19, the above-mentioned processing for suppressing a swindle of magnetic data can be performed.

A breakage detection signal which is a digital signal in a rectangular wave shape is supplied to the breakage detection wirings 33d, 33f and 33h. The breakage detection wirings 33d, 33f and 33h are structured of one wiring line formed on the flexible printed circuit board 19. In the embodiment shown in FIG. 4 and FIG. 5, the breakage detection wiring 33d is closely and densely extended and provided in the rectangular part 19n of the second circuit layer 34. The rectangular part 19n has two bent parts 20 and is three-dimensionally provided in an inside of the protruded part 14 in a bent state (see FIG. 2) and thus, the breakage detection wiring 33d is also three-dimensionally disposed in the inside of the protruded part 14.

One end of the wiring line forming the breakage detection wirings 33d, 33f and 33h is connected with the breakage detection circuit formed in the control circuit board 13, and the other end of the wiring line forming the breakage detection wirings 33d, 33f and 33h is grounded. Further, the one end of the wiring line forming the breakage detection wirings 33d, 33f and 33h is connected with a battery which is mounted on the control circuit board 13 through the breakage detection circuit of the control circuit board 13. The breakage detection wirings 33d, 33f and 33h are extended from the connected part 19a and routed through the first straight line connection part 19f, the elliptical connection part 19h, the connection part 19m and the rectangular part 19n in this order, and then, turned around in the rectangular part 19n and routed to the connected part 19a.

When the breakage detection circuit which is formed in the control circuit board 13 detects at least one of disconnection and a short circuit of the breakage detection wirings 33d, 33f and 33h based on a potential variation of the breakage detection wirings 33d, 33f and 33h, the above-mentioned processing for suppressing a swindle of magnetic data is performed. As a result, for example, when the protruded part 14 is broken for attaching a magnetic data swindle member to a front face of the exposed part 11b, disconnection or a short circuit of the breakage detection wiring 33d in the inside of the protruded part 14 occurs to prevent a swindle of magnetic data.

Principal Effects in this Embodiment

In the card reader 1 in this embodiment, the protruded part 14 protruded to a front side with respect to the exposed part 11b is provided on a front face of the exposed part 11b (card insertion part) having the insertion port 10 into which a card 2 is inserted. Therefore, it is difficult to attach a magnetic data swindle member to a front face of the exposed part 11b and thus, a swindle of magnetic data is suppressed. In addition, in the card reader 1, the breakage detection wiring 33d is provided in an inside of the protruded part 14 to detect at least one of disconnection and a short circuit of the breakage detection wiring 33d and thus, even when the protruded part 14 is broken for attaching a magnetic data swindle member, a swindle of magnetic data is suppressed by performing processing such as a function stop.

Other Embodiments

Although the present invention has been shown and described with reference to a specific embodiment, various changes and modifications will be apparent to those skilled in the art from the teachings herein.

For example, in the embodiment described above, the breakage detection wirings 33d, 33f and 33h are disposed so as to route through the first circuit layer 32 and the second circuit layer 34. However, it may be structured that the breakage detection wirings 33d, 33f and 33h are disposed so as to route through the first circuit layer 32 or the second circuit layer 34.

Further, in the embodiment described above, the flexible printed circuit board 19 is provided with the breakage detection wirings 33a and 33b and the breakage detection wirings 33d, 33f and 33h. However, it may be structured that the flexible printed circuit board 19 is provided with the breakage detection wirings 33d, 33f and 33h and the flexible printed circuit board 19 is not provided with the breakage detection wirings 33a and 33b.

Further, wiring patterns of the breakage detection wirings 33a, 33b, 33d, 33f and 33h which are closely and densely extended and arranged in the flexible printed circuit board 19 are not limited to the wiring patterns shown in FIG. 4 and FIG. 5. The wiring patterns may be arbitrarily designed.

In the embodiment described above, the flexible printed circuit board 19 is structured in a multilayer structure. However, the flexible printed circuit board 19 may be structured in a single layer structure. Further, in the embodiment described above, the flexible printed circuit board 19 in which the data signal circuits 31*a* and 31*b* are provided is provided with the breakage detection wirings 33*d*, 33*f* and 33*h*. However, it may be structured that the breakage detection wirings 33*d*, 33*f* and 33*h* are provided in another flexible printed circuit board which is different from the flexible printed circuit board 19.

Further, a position where the protruded part 14 is provided on the exposed part 11*b* is not limited to the position shown in FIG. 1 and the like, and the protruded part 14 may be attached at a position where attachment of a magnetic data swindle member to a front face of the exposed part 11*b* is obstructed.

As described above, the following features are disclosed in the present specification.

(1) A card reader for use with a card includes a card insertion part having an insertion port into which the card is inserted, a protruded part which is provided on a front face of the card insertion part and is protruded to a front side with respect to the card insertion part, a breakage detection wiring which is provided in an inside of the protruded part, and a detection part which detects at least one of disconnection and a short circuit of the breakage detection wiring.

According to the above-mentioned structure (1), the protruded part which is protruded to a front side with respect to the card insertion part is provided on a front face of the card insertion part having the insertion port into which a card is inserted and thus, it is difficult to attach a magnetic data swindle member to the front face of the card insertion part and a swindle of magnetic data is suppressed. In addition, a breakage detection wiring is provided in an inside of the protruded part to detect at least one of disconnection and a short circuit of the breakage detection wiring and thus, even when the protruded part is broken for attaching a magnetic data swindle member, a swindle of magnetic data is suppressed by performing processing such as a function stop.

(2) The card reader described in the above-mentioned structure (1), in which the protruded part is provided so as to be adjacent to the insertion port on the front face of the card insertion part.

According to the above-mentioned structure (2), it is further surely difficult to attach a magnetic data swindle member to the front face of the card insertion part.

(3) The card reader described in the above-mentioned structure (2), in which the protruded part is provided so as to be adjacent to a portion of the insertion port where a magnetic stripe of a card which is inserted into the insertion port is passed.

According to the above-mentioned structure (3), it is further difficult to attach a magnetic data swindle member, for example, a magnetic head or the like, which is required to dispose on the periphery of a portion where a magnetic stripe of a card is passed for swindling magnetic data of the card.

(4) The card reader described in one of the above-mentioned structures (1) through (3), in which the card reader includes a flexible printed circuit board, and the breakage detection wiring is formed in a portion of the flexible printed circuit board which is disposed in an inside of the protruded part.

According to the above-mentioned structure (4), the breakage detection wiring can be flexibly disposed in an inside of the protruded part and thus, various types of breakages in the protruded part can be detected.

(5) The card reader described in the above-mentioned structure (4), in which the detection part is provided in a portion which is different from the inside of the protruded part, and the detection part is connected with the breakage detection wiring through a wiring line formed in the flexible printed circuit board.

According to the above-mentioned structure (5), the detection part is provided in a portion which is different from an inside of the protruded part and thus, a situation that the detection part does not operate by breakage of the protruded part can be suppressed.

(6) The card reader described in the above-mentioned structure (4) or (5), in which the flexible printed circuit board has a signal wiring line connecting a magnetic head which reads out magnetic information of a card inserted into the insertion port with a processing part which performs processing based on the magnetic information.

According to the above-mentioned structure (6), breakage of the protruded part can be detected by utilizing a flexible printed circuit board which is connected with the magnetic head.

(7) The card reader described in the above-mentioned structure (6), in which the flexible printed circuit board is provided with a connection part which is disposed on a side with respect to the magnetic head and connects a portion formed with the breakage detection wiring in the flexible printed circuit board with a portion formed with the signal wiring line in the flexible printed circuit board.

According to the above-mentioned structure (7), a connection part which connects a portion formed with the breakage detection wiring in the flexible printed circuit board with a portion formed with the signal wiring line in the flexible printed circuit board is disposed on a side of the magnetic head and thus, the magnetic head and the protruded part which has the breakage detection wiring in its inside can be disposed in a space-saving manner in the front and rear direction.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A card reader for use with a card, the card reader comprising:
   a card insertion part comprising an insertion port into which the card is inserted,
   a protruded part which is provided on a front face of the card insertion part and is protruded to a front side with respect to the card insertion part,
   a breakage detection wiring which is provided in an inside of the protruded part;
   a detection part which detects at least one of disconnection and a short circuit of the breakage detection wiring; and
   a flexible printed circuit board, wherein the protruded part is provided so as to be adjacent to the insertion port and is protruded from the front face of the card insertion part, and wherein the breakage detection wiring is formed in a portion of the flexible printed circuit board which is disposed in the inside of the protruded part.

2. The card reader according to claim 1, wherein the protruded part is provided so as to be adjacent to a portion of the insertion port where a magnetic stripe of the card which is inserted into the insertion port is passed.

3. The card reader according to claim 2, wherein the detection part is provided in a portion which is different from the inside of the protruded part, and the detection part is connected with the breakage detection wiring through a wiring line formed in the flexible printed circuit board.

4. The card reader according to claim 3, wherein the flexible printed circuit board comprises a signal wiring line which connects a magnetic head which reads out magnetic information of the card inserted into the insertion port with a processing part which performs processing based on the magnetic information.

5. The card reader according to claim 4, wherein the flexible printed circuit board comprises a connection part which is disposed on a side with respect to the magnetic head and connects a portion formed with the breakage detection wiring in the flexible printed circuit board with a portion formed with the signal wiring line in the flexible printed circuit board.

6. The card reader according to claim 1, wherein the detection part is provided in a portion which is different from the inside of the protruded part, and the detection part is connected with the breakage detection wiring through a wiring line formed in the flexible printed circuit board.

7. The card reader according to claim 1, wherein the flexible printed circuit board comprises a signal wiring line which connects a magnetic head which reads out magnetic information of the card inserted into the insertion port with a processing part which performs processing based on the magnetic information.

8. The card reader according to claim 7, wherein the flexible printed circuit board comprises a connection part which is disposed on a side with respect to the magnetic head and connects a portion formed with the breakage detection wiring in the flexible printed circuit board with a portion formed with the signal wiring line in the flexible printed circuit board.

9. The card reader according to claim 1, wherein the protruded part is formed in a substantially triangular shape which has a bottom side parallel to the front face of the card insertion part when viewed in a short width direction of the card having been inserted, an upper face of the protruded part protruded in the substantially triangular shape is inclined downward toward the front side with respect to the card insertion part and is smoothly connected with a bottom face of a card moving path in the insertion port, the upper face of the protruded part is capable of guiding the card which is inserted into the insertion port, and the portion of the flexible printed circuit board formed with the breakage detection wiring is disposed on a front side with respect to the insertion port in the inside of the protruded part.

* * * * *